United States Patent
Kwon et al.

(10) Patent No.: US 8,716,776 B2
(45) Date of Patent: May 6, 2014

(54) METHOD OF FABRICATING ISOLATED CAPACITORS AND STRUCTURE THEREOF

(75) Inventors: Oh-Jung Kwon, Hopewell Junction, NY (US); Junedong Lee, Hopewell Junction, NY (US); Paul C. Parries, Hopewell Junction, NY (US); Dominic J. Schepis, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/533,099

(22) Filed: Jun. 26, 2012

(65) Prior Publication Data

US 2012/0267754 A1    Oct. 25, 2012

Related U.S. Application Data

(62) Division of application No. 12/838,515, filed on Jul. 19, 2010.

(51) Int. Cl.
*H01L 29/12* (2006.01)
(52) U.S. Cl.
USPC .................................. 257/301; 257/E27.084
(58) Field of Classification Search
USPC .................... 257/71, 301, E21.092, E27.084; 438/391
See application file for complete search history.

(56) References Cited

U.S. PATENT DOCUMENTS

| | | | |
|---|---|---|---|
| 4,621,414 A | 11/1986 | Iranmanesh | |
| 4,816,884 A | 3/1989 | Hwang et al. | |
| 5,358,891 A | 10/1994 | Tsang et al. | |
| 5,411,913 A | 5/1995 | Bashir et al. | |
| 5,814,547 A | 9/1998 | Chang | |
| 5,926,717 A | 7/1999 | Michael et al. | |
| 6,313,012 B1 | 11/2001 | Horiuchi et al. | |
| 6,372,609 B1 | 4/2002 | Aga et al. | |
| 6,426,252 B1 | 7/2002 | Radens et al. | |
| 6,558,998 B2 | 5/2003 | Belleville et al. | |
| 6,590,259 B2 | 7/2003 | Adkisson et al. | |
| 6,703,273 B2 | 3/2004 | Wang et al. | |
| 6,737,316 B2 | 5/2004 | Lee | |

(Continued)

FOREIGN PATENT DOCUMENTS

WO    2010023308 A1    3/2010

OTHER PUBLICATIONS

Office Action for U.S. Appl. No. 12/838,515 dated Aug. 31, 2012.

(Continued)

*Primary Examiner* — William F Kraig
*Assistant Examiner* — Joseph C Nicely
(74) *Attorney, Agent, or Firm* — Steven Meyers; Roberts Mlotkowski Safran & Cole, P.C.

(57) ABSTRACT

A structure and method is provided for fabricating isolated capacitors. The method includes simultaneously forming a plurality of deep trenches and one or more isolation trenches surrounding a group or array of the plurality of deep trenches through a SOI and doped poly layer, to an underlying insulator layer. The method further includes lining the plurality of deep trenches and one or more isolation trenches with an insulator material. The method further includes filling the plurality of deep trenches and one or more isolation trenches with a conductive material on the insulator material. The deep trenches form deep trench capacitors and the one or more isolation trenches form one or more isolation plates that isolate at least one group or array of the deep trench capacitors from another group or array of the deep trench capacitors.

5 Claims, 7 Drawing Sheets

(56) References Cited

U.S. PATENT DOCUMENTS

| | | | |
|---|---|---|---|
| 6,885,080 B2 | 4/2005 | Chen et al. | |
| 7,195,972 B2 | 3/2007 | Chidambarrao et al. | |
| 7,745,902 B1 | 6/2010 | Foote | |
| 7,951,666 B2 | 5/2011 | Ho et al. | |
| 7,984,408 B2 * | 7/2011 | Cheng et al. | 716/119 |
| 8,035,163 B2 | 10/2011 | Nguyen et al. | |
| 8,222,065 B1 | 7/2012 | Smeys et al. | |
| 8,354,675 B2 * | 1/2013 | Kwon et al. | 257/71 |
| 2002/0008299 A1 | 1/2002 | Leonardi | |
| 2002/0042169 A1 | 4/2002 | Lutzen et al. | |
| 2003/0162400 A1 | 8/2003 | Chen et al. | |
| 2005/0156218 A1 | 7/2005 | Nirschl et al. | |
| 2006/0177991 A1 | 8/2006 | Murakami et al. | |
| 2006/0202249 A1 | 9/2006 | Cheng et al. | |
| 2006/0249790 A1 | 11/2006 | Chen et al. | |
| 2007/0262411 A1 | 11/2007 | Rauscher | |
| 2008/0286937 A1 | 11/2008 | Mitani | |
| 2009/0102026 A1 | 4/2009 | Lee et al. | |
| 2009/0108349 A1 * | 4/2009 | Kim et al. | 257/347 |
| 2009/0289292 A1 | 11/2009 | Park | |
| 2010/0090303 A1 | 4/2010 | Takizawa | |
| 2010/0291755 A1 | 11/2010 | Isaka et al. | |
| 2011/0086490 A1 | 4/2011 | Wang et al. | |
| 2011/0092045 A1 | 4/2011 | El-Kareh | |
| 2011/0121363 A1 | 5/2011 | Cheng et al. | |
| 2011/0193193 A1 | 8/2011 | Dube et al. | |
| 2011/0204384 A1 * | 8/2011 | Cheng et al. | 257/77 |
| 2011/0207306 A1 | 8/2011 | Cherekdjian et al. | |
| 2011/0233732 A1 | 9/2011 | De Monsabert et al. | |
| 2011/0272702 A1 * | 11/2011 | Kwon et al. | 257/71 |
| 2011/0284930 A1 * | 11/2011 | Hershberger et al. | 257/270 |
| 2012/0129324 A1 | 5/2012 | Cherekdjian | |

OTHER PUBLICATIONS

Final Office Action for U.S. Appl. No. 12/838,515 dated Feb. 15, 2013.

International Search Report of the International Searching Authority for Application No. PCT/US2011/042289, date of mailing Feb. 17, 2012.

Written Opinion of the International Searching Authority for Application No. PCT/US2011/042289, date of mailing Feb. 17, 2012.

J.-O. Plouchart, "SO1 nano-technology for high-performance system on-chip applications," IEEE Int. SOI Conference, Sep. 29-Oct. 2, 2003, pp. 1-4.

R. E. Matick et al., "Logic-based eDRAM: Origins and rationale for use," IBM J. Res. & Dev., vol. 49, No. 1, 2005, pp. 145-165.

Office Action for related U.S. Appl. No. 12/838,515 dated Jun. 6, 2013.

Notice of Allowance dated Oct. 1, 2013 for related U.S. Appl. No. 12/838,515, 9 pages.

* cited by examiner

METHOD OF FABRICATING ISOLATED CAPACITORS AND STRUCTURE THEREOF

CROSS REFERENCE TO RELATED APPLICATIONS

This application is a divisional application of U.S. application Ser. No. 12/838,515, filed on Jul. 19, 2010, the contents of which are incorporated by reference in their entirety herein.

FIELD OF THE INVENTION

The invention relates to a semiconductor structure and methods of manufacture and, more particularly, to a method of fabricating isolated capacitors and a resulting structure.

BACKGROUND

The performance of the CMOS logic devices has been greatly improved by using SOI (Silicon-On-Insulator) substrate. Yet, further improvement of the SOI logic chip was achieved by integrating DRAM compartments within the logic chip (e.g., Embedded DRAM on SOD. Dynamic random access memory (DRAM) is a type of random access memory that stores each bit of data in a separate capacitor within an integrated circuit. The advantage of DRAM is its structural simplicity; i.e., only one transistor and a capacitor are required per bit, compared to six transistors in SRAM. This allows DRAM to reach very high density. DRAM cell structures have been successfully scaled for several decades to increasingly smaller dimensions that allow for reducing manufacturing costs and increasing levels of integration within the DRAM cell structures.

While DRAM cell structures have been successfully scaled for several decades, the scaling of DRAM cell structures is not entirely without problems. In particular, such scaling, while physically achievable for both a field effect transistor and a storage capacitor within a dynamic random access memory cell structure, is problematic for the storage capacitor insofar as storage capacitors when aggressively scaled may not have adequate storage capacitance for proper operation of a dynamic random access memory cell structure.

However, it is becoming more and more difficult to maintain enhanced performance at decreased dimensions. Particularly, forming buried plate electrodes became extremely challenging. For example, with deep trench capacitors in SOI, the conventional diffusion doping or implanting process is becoming very difficult through smaller and smaller deep trench openings. That is, as the openings of the deep trench become smaller, it is becoming increasingly more difficult to implant dopants into the opening in order to form one of the plates from the substrate material. Also, during the doping process, unwanted implants are being implanted into the SOI. Additionally, due to the small spacing between the deep trenches, leakage between DT arrays become problematic. This leakage (i.e., lack of isolation between the deep trenches) results in adjacent capacitors turning on and off at the same time. Moreover, it has been found that after the SOI bonding/anneal process, dopants such as, for example, phosphorous, tend to diffuse from an epi layer into the underlying substrate, which may cause isolation issues.

Accordingly, there exists a need in the art to overcome the deficiencies and limitations described hereinabove.

SUMMARY

In a first aspect of the invention, a method comprises simultaneously forming a plurality of deep trenches and one or more isolation trenches surrounding a group or array of the plurality of deep trenches through a SOI and doped poly layer, to an underlying insulator layer. The method further comprises lining the plurality of deep trenches and one or more isolation trenches with an insulator material. The method further comprises filling the plurality of deep trenches and one or more isolation trenches with a conductive material on the insulator material. The deep trenches form deep trench capacitors and the one or more isolation trenches form one or more isolation plates that isolate at least one group or array of the deep trench capacitors from another group or array of the deep trench capacitors.

In another aspect of the invention, a method comprises forming an insulator layer on a substrate. The method further comprises forming a doped poly layer on the insulator layer. The method further comprises bonding a silicon on insulator (SOI) structure to the doped poly layer. The method further comprises forming a plurality of deep trenches and one or more isolation trenches surrounding an array or group of the plurality of deep trenches into the doped poly layer and SOI structure. The method further comprises forming an insulator layer on sidewalls of the deep trenches and the one or more isolation trenches. The method further comprises forming a conductive metal over the insulator layer.

In yet another aspect of the invention, a structure comprises one or more groups of deep trench capacitors formed in an SOI and n+ doped poly layer. The deep trench capacitors comprise an insulator material between and in direct contact with the n+ doped poly layer and a conductive plate formed in a trench. The structure further comprises one or more deep trench isolation structures formed in the SOI and n+ doped poly layer, which isolate at least one of the one or more groups of deep trench capacitors from another group.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of isolated capacitor structures (ISC), which comprises the structures of the present invention. In still further embodiments, a method in a computer-aided design system is provided for generating a functional design model of the ISC. The method comprises generating a functional representation of the structural elements of the ISC.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a semiconductor structure and methods of manufacture and, more particularly, to a method of fabricating isolated capacitors and a resulting structure. More specifically, the present invention is directed to a method of fabricating eDRAM on SOI using buried isolation plates. In embodiments, the buried isolation plates are polysilicon plates. Advantageously, the buried isolation plates provide an isolation between each array or grouping of capacitors, while eliminating leakage between n-bands. The present invention also eliminates unwanted implants in the SOI, as well as improves scaling capabilities over conventional methodologies. For example, by using the present invention, it is possible to scale the device, without concern for implanting through small deep trench openings.

Figure 1:
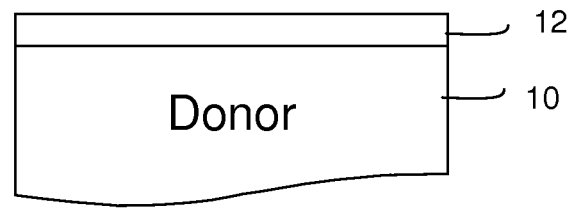
FIG. 1 shows a starting structure in accordance aspects of the invention.

FIG. 1 shows a starting structure in accordance with the present invention. The starting structure includes, for example, a donor substrate 10 having an oxide layer 12. In embodiments, the donor substrate 10 is silicon (SOI). The oxide 12 can be deposited using a thermal oxidation process known to those of skill in the art. The oxide 12 can have a thickness of about 150 nm; although other dimensions are also contemplated by the present invention.

Figure 2:
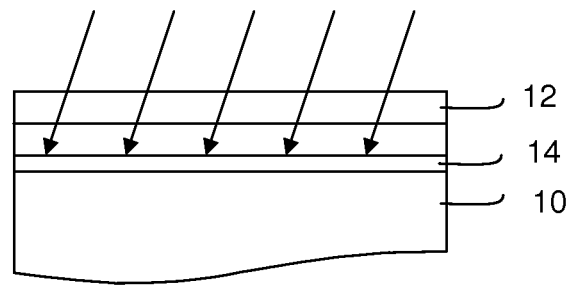
FIGS. 2-6, 7a, 7b, 8 and 9 show additional structures and respective processing steps in accordance with aspects of the invention.

FIG. 2 shows an ion implantation process. For example, the ion implantation process is a H+ ion implantation process that forms layer 14. The structures of FIGS. 1 and 2 are conventional structures, well known to those of skill in the art and, as such, further explanation is not required herein.

Figure 3:
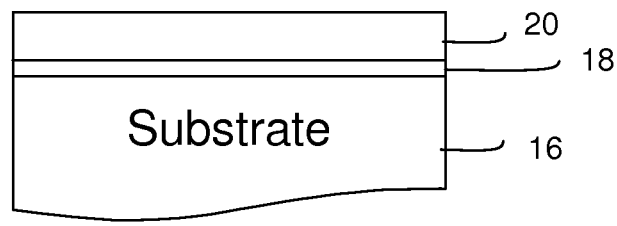

FIG. 3 shows another structure and processing steps in accordance with the present invention. In FIG. 3, an insulator layer 18 is deposited on a substrate 16. The insulator layer 18 can have a thickness of about 1000 Å; although other dimensions are also contemplated by the present invention. In embodiments, the insulator layer 18 may be, for example, an oxide, nitride, hafnium oxide, high-k material or other dielectric material. In embodiments, the insulator layer 18 acts as a diffusion barrier layer to prevent dopants from diffusing into the underlying layer. A doped poly layer 20 is deposited on the insulator layer 18. In embodiments, the doped poly layer 20 is an N+ poly layer, which can be deposited using a conventional chemical vapor deposition process. The doped poly layer 20 is about 4 microns thick. This thickness advantageously provides enough material to form a deep trench, while ensuring that the doped poly layer 20 can act as a plate of a capacitor.

The use of the doped poly layer 20 eliminates the need for doping a trench structure, as in conventional fabrication processes. Also, by using the doped poly layer 20, it is easy to scale the structure to smaller nodes, since there is no further processing requirements for doping within a deep trench structure. Advantageously, the doped poly layer 20 also prevents unwanted implants in the SOI layer 10.

Figure 4:
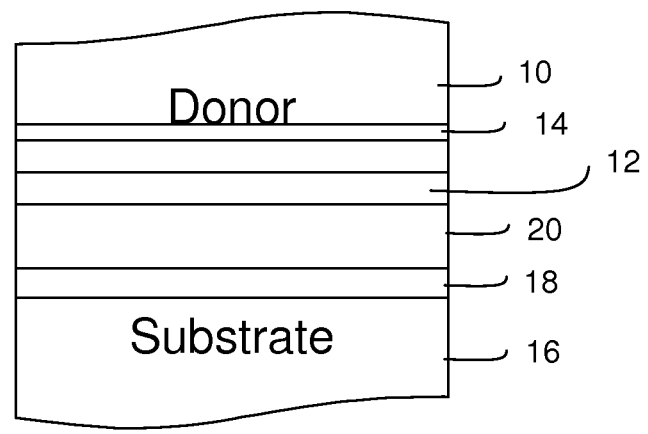
Figure 5:
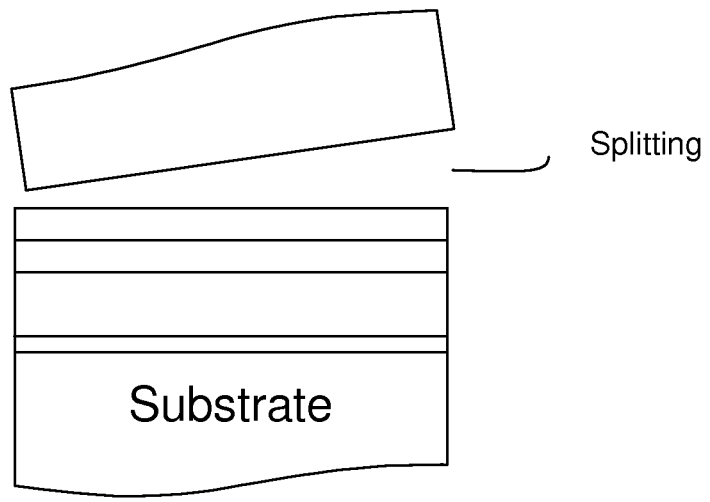

In FIG. 4, the structures of FIGS. 2 and 3 are bonded together using conventional bonding techniques. For example, the structure of FIG. 2 can be flipped over and bonded to the structure of FIG. 3 using, for example, adhesion bonding techniques. Accordingly, after the doped poly layer 20 is formed, it can be bonded directly to the oxide layer 12. In FIG. 5, the donor substrate 10 is split using conventional splitting processes to form a SOI layer 10.

Figure 6:
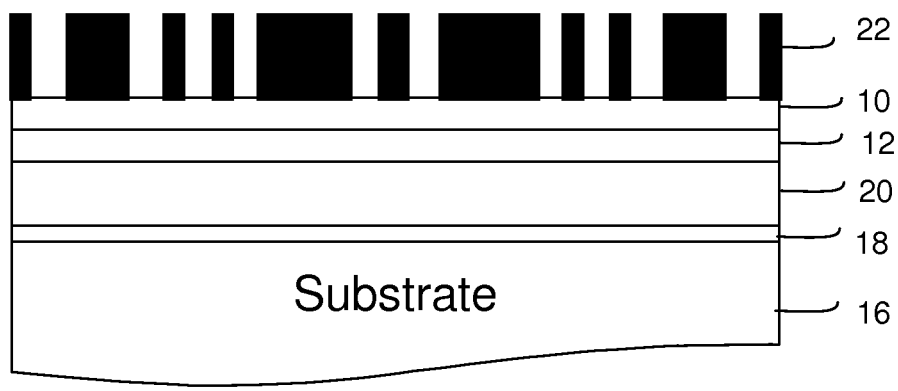

In FIG. 6, a photoresist mask 22 is placed over the SOI layer 10 using conventional processes. For example, the photoresist mask 22 may be deposited by spin-coating over pad films (oxide/nitride) deposited on the SOI layer 10 using CVD processes. In embodiments, the photoresist mask 22 is then patterned using conventional lithographic processes. For example, the photoresist mask 22 can be exposed to light to open holes therein. The holes will correspond with trenches formed within the structure.

Figure 7A:
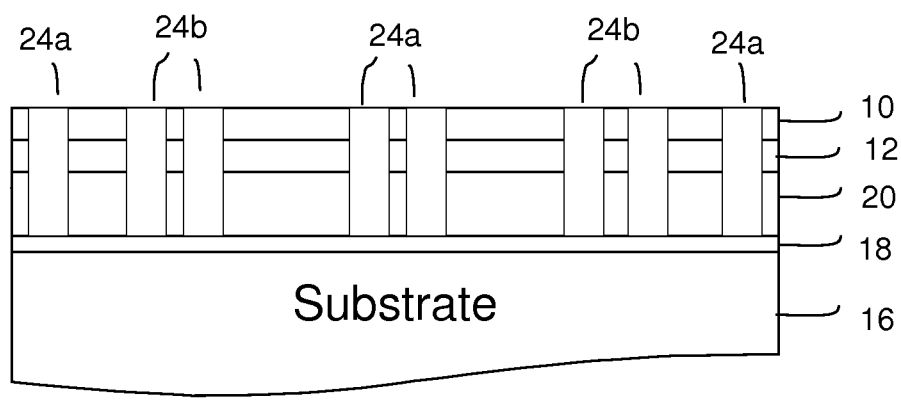
Figure 7B:
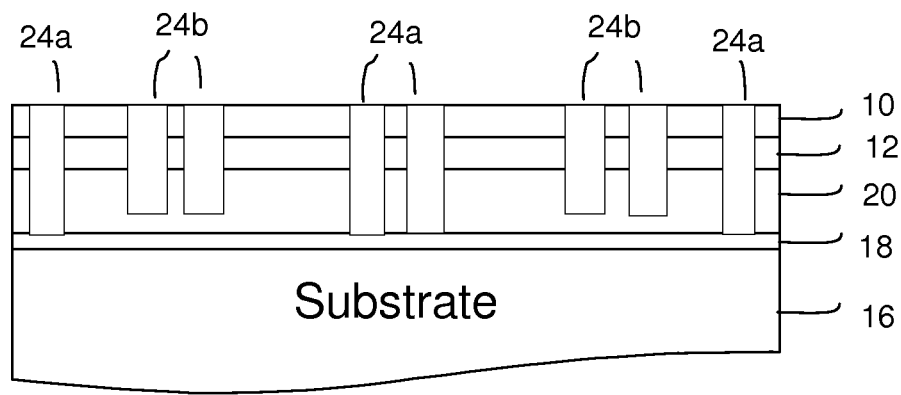

In FIG. 7a, the structure undergoes an etching process to simultaneously form deep trenches 24a and 24b. In embodiments, the deep trenches 24a surround the deep trenches 24b, thereby isolating the deep trenches 24b. Advantageously, the deep trenches 24a are used to form buried isolation plates (or moats) which provide an isolation structure between each array or grouping of capacitors, while eliminating leakage between the arrays. In this way, the deep trenches 24b can be formed as isolation plates for a capacitor structure such as, for example, eDRAM. The deep trenches 24a should be formed extending to the insulator layer 18 to provide an adequate electrical isolation. In embodiments, the deep trenches 24b can be formed within the Poly layer (FIG. 7b) or extended to the insulator layer 18 for maximum capacitance. Also, in embodiments, as the deep trenches 24a, 24b are formed simultaneously, the deep trenches 24a, 24b can be etched to a same depth.

Figure 8:
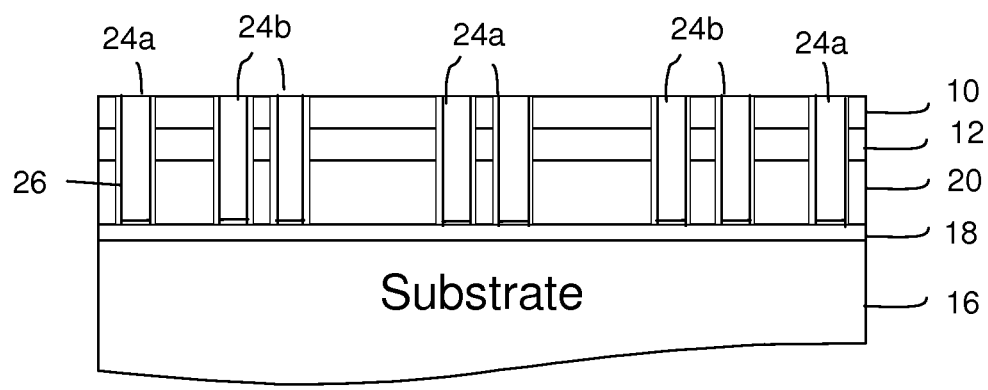

In FIG. 8, an insulator material 26 is provided within the deep trenches 24a, 24b. More specifically, the deep trenches 24a, 24b are simultaneously lined with the insulator material 26, which includes sidewalls and a bottom thereof. In embodiments, the insulator material 26 can be a high-k dielectric, nitride or oxide, amongst other types of known insulator materials used for forming capacitors. In embodiments, the oxide, for example, can be thermally grown. In embodiments, the insulator material 26 is about 100 Å; although other dimensions are also contemplated by the present invention. The thickness of the insulator material 26 should not pinch off the trenches 24a, 24b.

Figure 9:
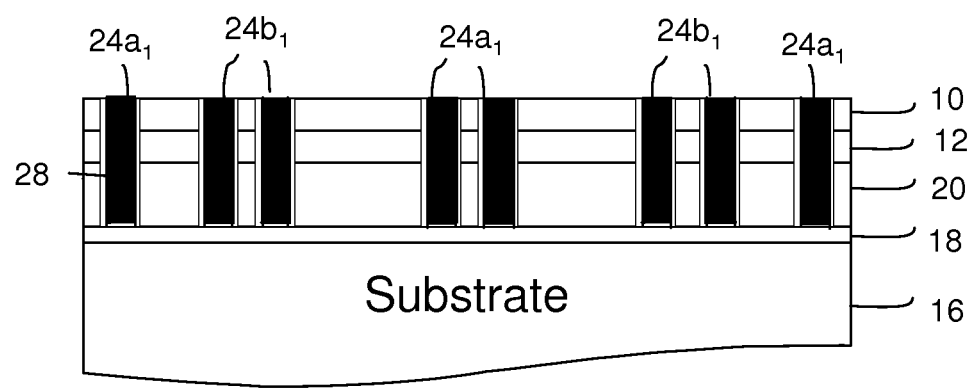

In FIG. 9, the trenches 24a, 24b are simultaneously filled with a conductive material 28 using conventional deposition processes, for example. In embodiments, the conductive material is a poly silicon layer 28, which acts as a conductive plate to form trench capacitors $24b_1$. The insulator material 26 is between and in direct contact with the poly silicon layer 28 and doped poly layer 20. In embodiments, any excess conductive material 28 on the surface of the SOI layer 10 may be cleaned using conventional etchants or planarization processes. The trench capacitors $24b_1$ remain surrounded by isolation plates $24a_1$, which act as an isolation moat.

Figure 10:
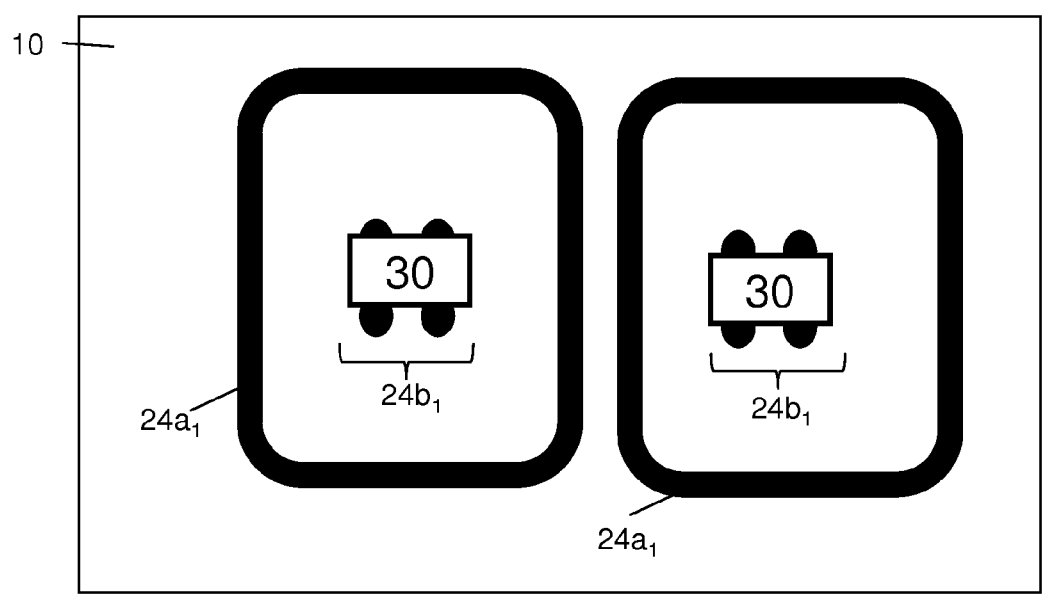
FIG. 10 shows a top view of the structure of FIG. 9.

FIG. 10 shows a top view of the structure of FIG. 9. As shown in FIG. 10, the isolation plates $24a_1$ surround and isolate the trench capacitors $24b_1$. In embodiments, the isolation plates $24a_1$ can be formed to surround and isolate any group or array of trench capacitors $24b_1$. In embodiments, the trench capacitors $24b_1$ are electrically connected to transistors 30.

Figure 11:
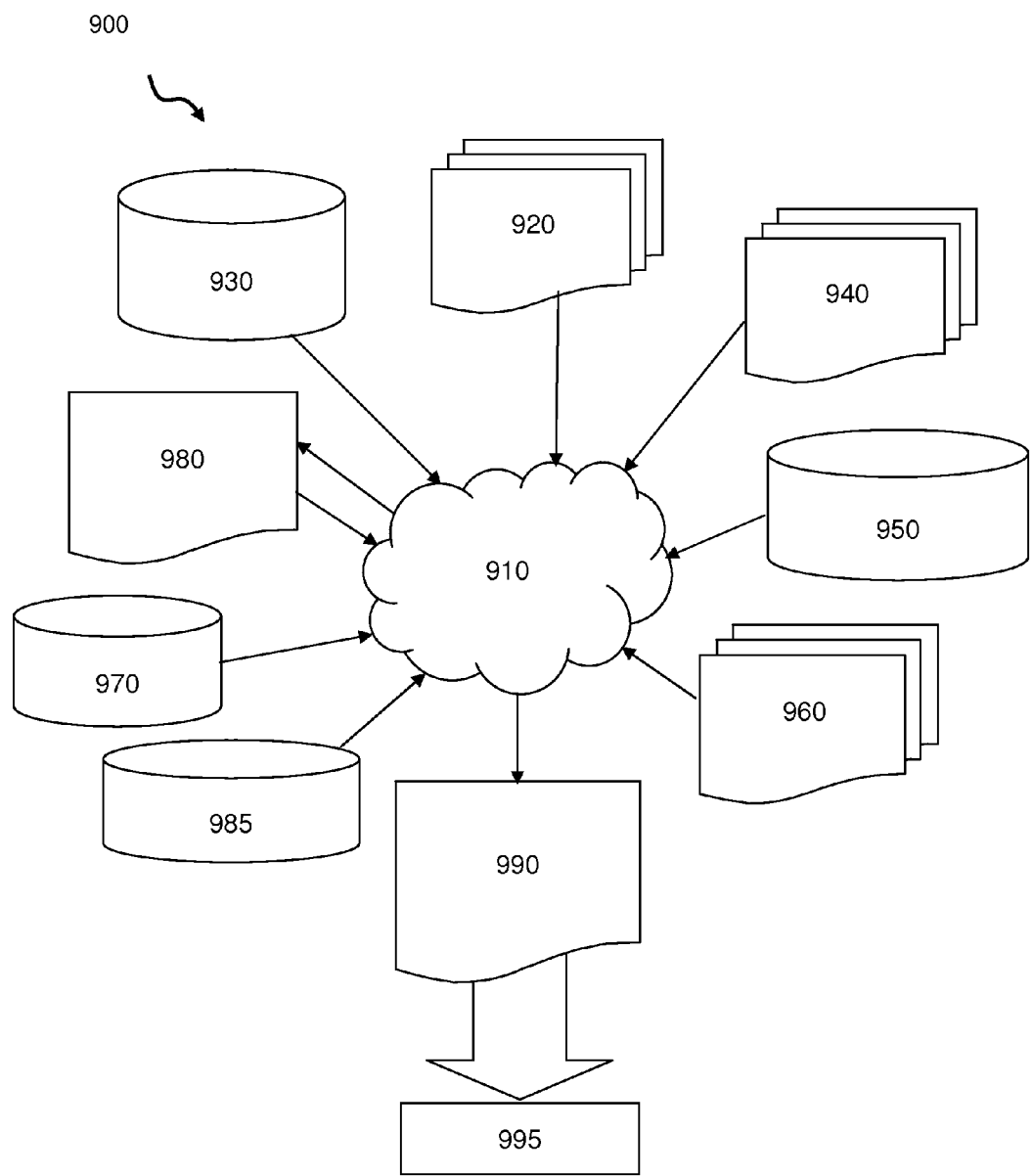
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 990 may comprise a compiled, executable HDL simulation model that functionally simulates the devices shown in FIGS. 1-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A hardware description language (HDL) design structure encoded on a machine-readable data storage device, said HDL design structure comprising elements that when processed in a computer-aided design system generates a machine-executable representation of deep trench capacitors, wherein said design structure comprises:

one or more groups of deep trench capacitors formed in an SOI and a n+ doped poly layer, and comprising an insulator material between and in direct contact with the n+ doped poly layer and a conductive plate formed in a trench; and one or more deep trench isolation structures formed in the SOI and n+ doped poly layer, which isolate at least one of the one or more groups of deep trench capacitors from another group.

2. The design structure of claim 1, wherein the design structure comprises a netlist.

3. The design structure of claim 1, wherein the design structure resides on the storage device as a data format used for the exchange of layout data of integrated circuits.

4. The design structure of claim 1, wherein the design structure resides in a programmable gate array.

5. The design structure of claim 1, further wherein the one or more groups of deep trench capacitors and the deep trench isolation structures include the insulator material directly contacting at least the n+ doped poly layer and a conductive material.

* * * * *